(12) United States Patent
Sada

(10) Patent No.: US 11,275,122 B2
(45) Date of Patent: Mar. 15, 2022

(54) BATTERY DIAGNOSIS METHOD, BATTERY DIAGNOSIS PROGRAM, BATTERY MANAGEMENT APPARATUS, AND POWER STORAGE SYSTEM

(71) Applicant: Panasonic Intellectual Property Management Co., Ltd., Osaka (JP)

(72) Inventor: Tomokazu Sada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 469 days.

(21) Appl. No.: 16/273,180

(22) Filed: Feb. 12, 2019

(65) Prior Publication Data

US 2019/0170831 A1    Jun. 6, 2019

Related U.S. Application Data

(63) Continuation of application No. PCT/JP2017/024477, filed on Jul. 4, 2017.

(30) Foreign Application Priority Data

Sep. 16, 2016  (JP) .............................. JP2016-182238

(51) Int. Cl.
*H02J 7/00* (2006.01)
*H02J 7/14* (2006.01)
(Continued)

(52) U.S. Cl.
CPC ..... *G01R 31/389* (2019.01); *G01R 19/16542* (2013.01); *G01R 31/3842* (2019.01);
(Continued)

(58) Field of Classification Search
USPC ....................................................... 320/109
See application file for complete search history.

(56) References Cited

U.S. PATENT DOCUMENTS

| 10,957,946 B2* | 3/2021 | Li .................... H02J 7/007184 |
| 2004/0095098 A1* | 5/2004 | Turner .................... H02J 7/345 320/167 |
| 2009/0256528 A1* | 10/2009 | Greening .............. H02J 7/0072 320/162 |
| 2012/0310571 A1* | 12/2012 | Takagi ................. G01R 31/392 702/65 |

(Continued)

FOREIGN PATENT DOCUMENTS

| JP | 2014-149280 | 8/2014 |
| JP | 2016-090346 | 5/2016 |

OTHER PUBLICATIONS

International Search Report of PCT application No. PCT/JP2017/024477 dated Oct. 3, 2017.

*Primary Examiner* — Alexis B Pacheco
(74) *Attorney, Agent, or Firm* — McDermott Will and Emery LLP

(57) ABSTRACT

A control unit in a battery management apparatus discharges constant direct current from a battery for a predetermined time period or charges the battery with the constant direct current for the predetermined time period to diagnose a state of the battery. A change point is identified where a rise in voltage given by subtracting open circuit voltage of the battery from measured voltage of the battery is varied from a curved line shape to a straight line shape with respect to transition of an increase of a value in which an elapsed time since start of charge-discharge is defined as a square root of time. A rise in voltage from the voltage when the charge-discharge is started to the change point is identified as a rise in voltage caused by resistance components of electrolyte, a negative electrode, and a positive electrode of the battery and a rise in voltage after the change point is identified as a rise in voltage caused by a diffusion resistance component of the battery.

14 Claims, 9 Drawing Sheets

(51) Int. Cl.
*G01R 31/389* (2019.01)
*H01M 10/48* (2006.01)
*H01M 10/44* (2006.01)
*H01M 10/42* (2006.01)
*G01R 31/392* (2019.01)
*G01R 31/3842* (2019.01)
*G01R 19/165* (2006.01)
*G01R 31/385* (2019.01)
*G01R 31/396* (2019.01)

(52) U.S. Cl.
CPC .......... *G01R 31/392* (2019.01); *H01M 10/42* (2013.01); *H01M 10/425* (2013.01); *H01M 10/44* (2013.01); *H01M 10/441* (2013.01); *H01M 10/48* (2013.01); *H02J 7/00* (2013.01); *G01R 31/386* (2019.01); *G01R 31/396* (2019.01); *H01M 2010/4271* (2013.01); *H01M 2010/4278* (2013.01); *H01M 2220/20* (2013.01)

(56) References Cited

U.S. PATENT DOCUMENTS

| | | | |
|---|---|---|---|
| 2013/0221753 A1* | 8/2013 | Perreault | H02J 3/381 |
| | | | 307/77 |
| 2013/0278221 A1* | 10/2013 | Maeda | B60L 58/15 |
| | | | 320/134 |
| 2014/0222358 A1* | 8/2014 | Morita | G01R 31/392 |
| | | | 702/63 |
| 2015/0231985 A1* | 8/2015 | Li | B60L 58/13 |
| | | | 320/134 |
| 2015/0301118 A1* | 10/2015 | Tao | H01M 10/48 |
| | | | 702/63 |
| 2015/0377976 A1* | 12/2015 | Maluf | G01R 31/392 |
| | | | 702/63 |
| 2016/0011274 A1* | 1/2016 | Morita | B60L 58/16 |
| | | | 702/63 |
| 2016/0254680 A1* | 9/2016 | Arai | H02J 7/0042 |
| | | | 320/107 |
| 2020/0381784 A1* | 12/2020 | Yamamoto | H02J 7/04 |

* cited by examiner

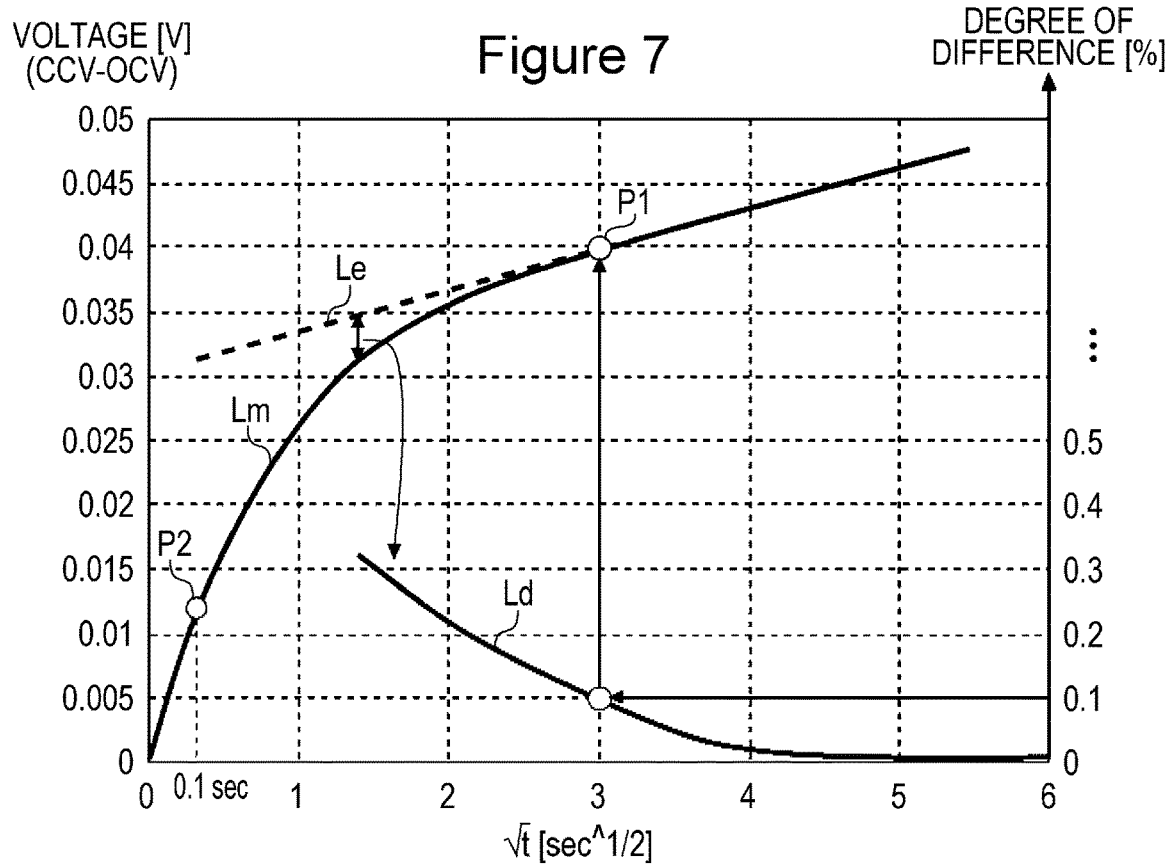
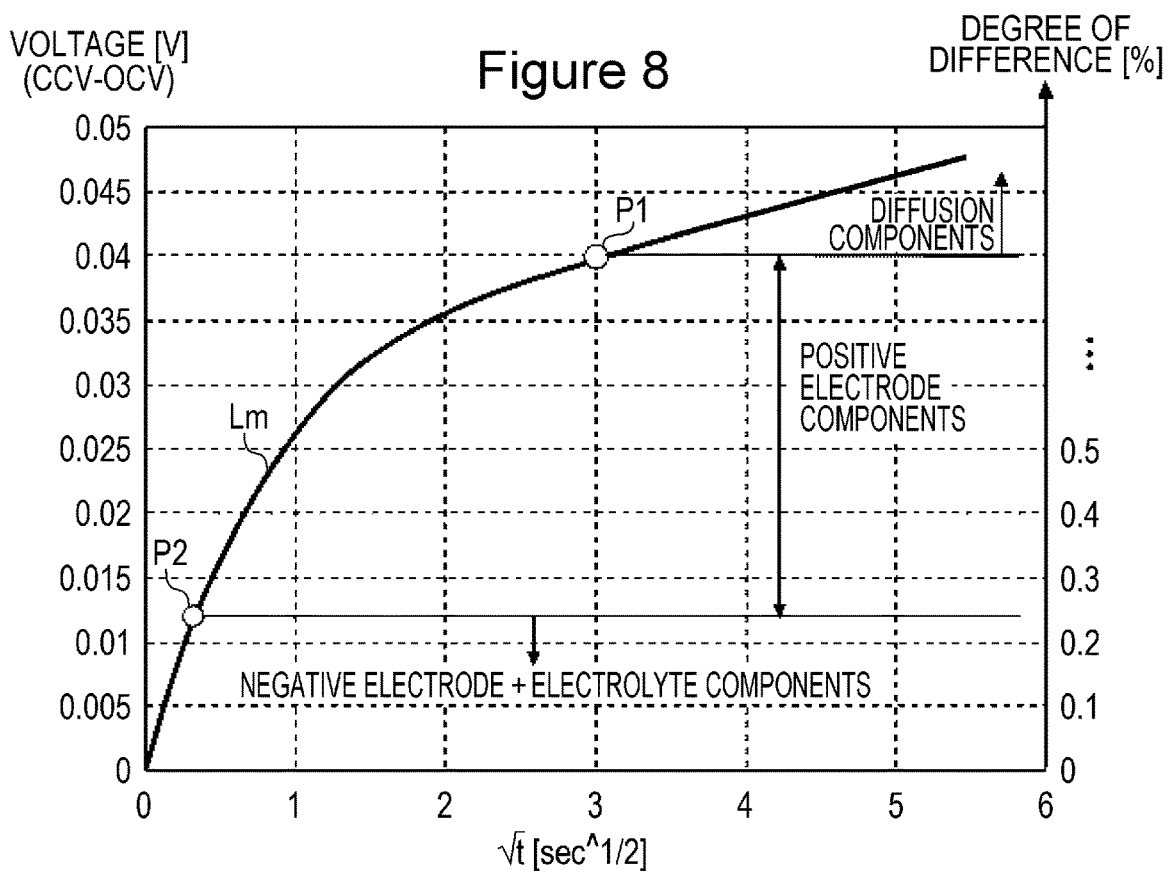

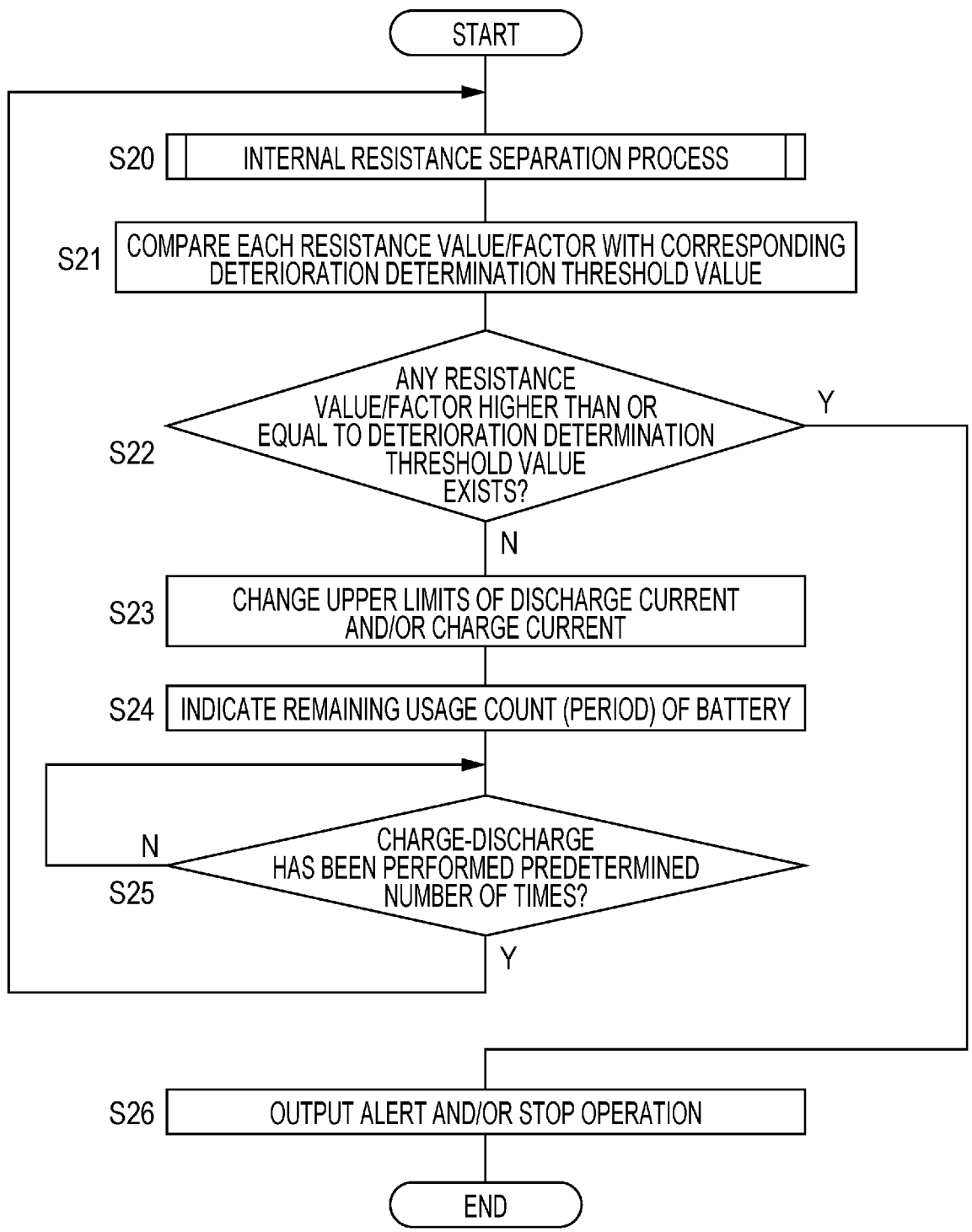

BATTERY DIAGNOSIS METHOD, BATTERY DIAGNOSIS PROGRAM, BATTERY MANAGEMENT APPARATUS, AND POWER STORAGE SYSTEM

TECHNICAL FIELD

The present invention relates to a battery diagnosis method of measuring the internal resistance of a battery to diagnose the battery, a battery diagnosis program, a battery management apparatus, and a power storage system.

BACKGROUND ART

Secondary batteries, such as lithium ion batteries and nickel hydride batteries, are used in various intended uses in recent years. For example, the secondary batteries are used in in-vehicle use for supplying electric power to traction motors of electric vehicles (EVs), hybrid electric vehicles (HEVs), and plug-in hybrid vehicles (PHVs), power storage use for peak shift and backup, frequency regulation (FR) use for stabilizing the frequencies of systems, and so on.

The secondary batteries are increased in their internal resistances and are increasingly deteriorated with usage time. The internal resistance of each secondary battery is mainly categorized into resistance components of its positive electrode, resistance components of its negative electrode, resistance components of its electrolyte, and diffusion resistance components. Analyzing the factor of the increase in internal resistance enables elaborate deterioration diagnosis to lead future improvement of the device.

Methods of analyzing the factor of the increase in internal resistance without decomposition of the secondary battery includes an alternating current impedance method (for example, refer to PTL 1). In the alternating current impedance method, alternating-current voltage is applied to the secondary battery while wide-range frequencies from low frequencies to high frequencies are being swept and the internal resistance is measured from response current. The measured internal resistance is plotted on a complex plane to identify and separate each resistance component based on the shape and the size of multiple arcs on the complex plane. With the alternating current impedance method, it is possible to separate responses having different time constants in the above manner.

CITATION LIST

Patent Literature

PTL 1: Japanese Published Unexamined Patent Application No. 2016-90346

SUMMARY OF INVENTION

A local oscillator capable of sweeping wide-range frequencies (in an order of millihertz to megahertz) is required in the alternating current impedance method. When the oscillator is mounted in a battery management apparatus, the cost is increased. Although a dedicated diagnosis apparatus including the oscillator may be used, external measurement of the internal resistance of each cell using the dedicated diagnosis apparatus after the operation of the secondary battery is started is a large-scale task. In addition, in order to perform the alternating current impedance method, it is necessary to stop a normal charge-discharge operation of the secondary battery. Accordingly, it is inconvenient for a user to perform the deterioration diagnosis using the alternating current impedance method after the operation of the secondary battery is started.

In order to resolve the above problems, it is an object of the present disclosure to provide a technology to simply perform separation analysis of the internal resistance of a secondary battery at a low cost.

In order to resolve the above problems, a battery diagnosis method in an aspect of the present disclosure includes discharging constant direct current from a battery for a predetermined time period or charging the battery with the constant direct current for the predetermined time period and measuring voltage of the battery. The battery diagnosis method includes identifying a change point where a rise in voltage given by subtracting open circuit voltage of the battery from the measured voltage of the battery is varied from a curved line shape to a straight line shape with respect to transition of an increase of a value in which an elapsed time since start of charge-discharge is defined as a square root of time, and identifying a rise in voltage from the voltage when the charge-discharge is started to the change point as a rise in voltage caused by resistance components of electrolyte, a negative electrode, and a positive electrode of the battery and identifying a rise in voltage after the change point as a rise in voltage caused by a diffusion resistance component of the battery.

Arbitrary combination of the above components and conversion of the representations of the present disclosure between the method, the apparatus, the system, and so on are also effective as aspects of the present disclosure.

According to the present disclosure, it is possible to simply perform the separation analysis of the internal resistance of a secondary battery at a low cost.

BRIEF DESCRIPTION OF DRAWINGS

FIG. 7 illustrates a sixth state of the resistance separation algorithm using the DCIR according to the present embodiment.

FIG. 8 illustrates a seventh state of the resistance separation algorithm using the DCIR according to the present embodiment.

FIG. 11 is a flowchart illustrating the flow of a deterioration diagnosis process performed by the battery management apparatus according to an embodiment of the present invention.

DESCRIPTION OF EMBODIMENTS

Figure 1:
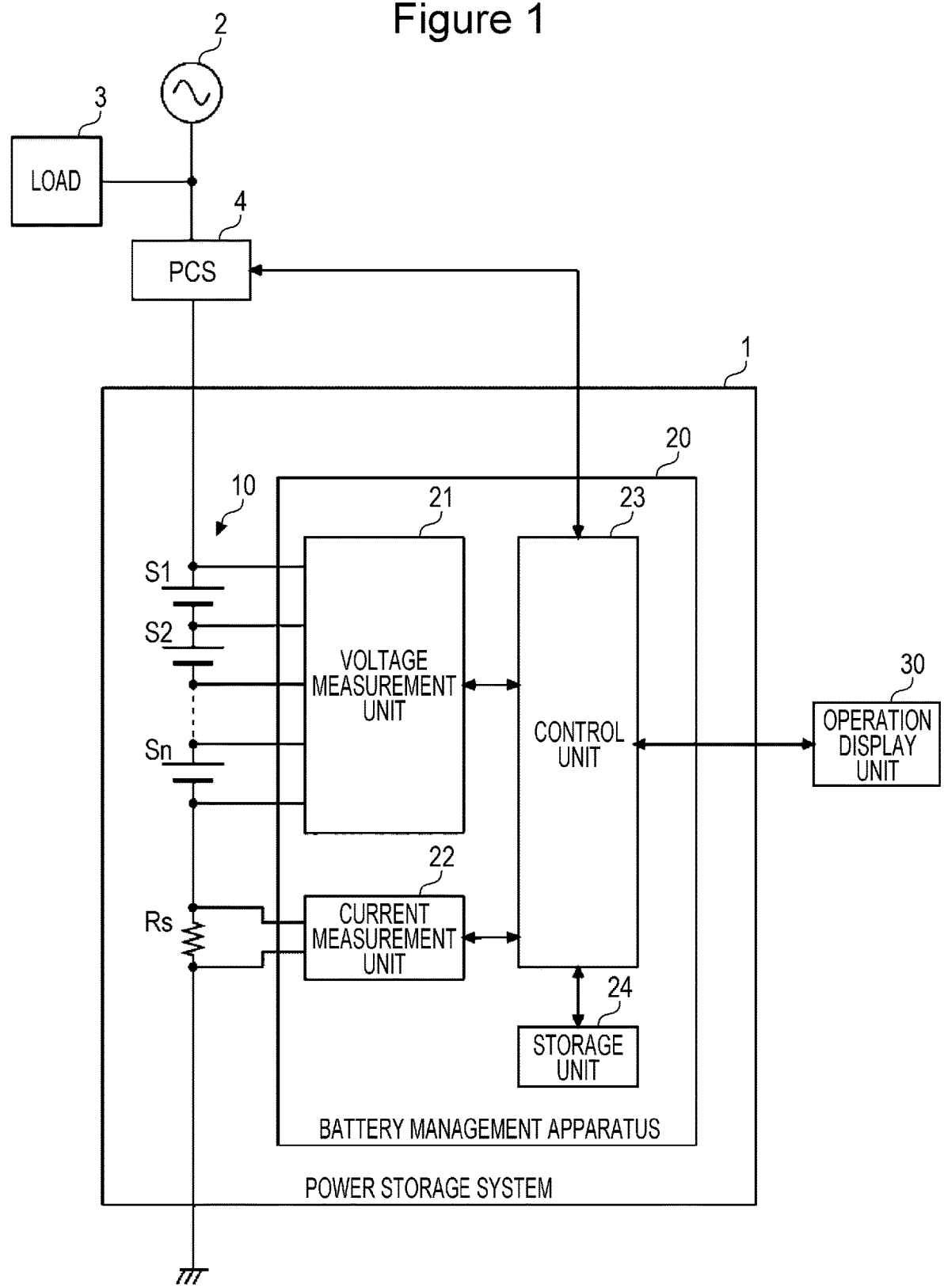
FIG. 1 is a diagram illustrating an exemplary configuration of a power storage system according to an embodiment of the present invention.

FIG. 1 is a diagram illustrating an exemplary configuration of a power storage system 1 according to an embodiment of the present invention. The power storage system 1 illustrated in FIG. 1 is an exemplary configuration of the stationary power storage system 1. The power storage system 1 includes a battery module 10 and a battery management apparatus 20. The battery module 10 is composed of multiple cells S1 to Sn that are connected in series to each other. The battery module 10 may be composed of multiple cells that are connected in parallel to each other or that are connected in series and parallel to each other. It is assumed in the present embodiment that a rectangular or cylindrical lithium ion battery (nominal voltage: 3.6 V to 3.7 V) is used for each of the cells S1 to Sn.

A power conditioner (PCS) 4 is connected between a commercial power supply system 2 (hereinafter simply referred to as a system 2) and the battery module 10. A load 3 is connected to a distribution line between the power conditioner 4 and the system 2. The power conditioner 4 includes a bidirectional direct current-direct current (DC-DC) converter (not illustrated) and a bidirectional inverter (not illustrated). The bidirectional DC-DC converter performs control for constant current (CC) charge-discharge or constant voltage (CV) charge-discharge, and the bidirectional inverter performs conversion from direct-current power to alternating-current power or conversion from the alternating-current power to the direct-current power. The bidirectional inverter may have the functions of both the bidirectional DC-DC converter and the bidirectional inverter without using the bidirectional DC-DC converter.

The battery management apparatus 20 includes a voltage measurement unit 21, a current measurement unit 22, a control unit 23, and a storage unit 24. The voltage measurement unit 21 measures the voltage value of each of the multiple cells S1 to Sn with a predetermined sampling period (for example, a period of 0.1 seconds) and supplies the measured voltage value to the control unit 23. The voltage measurement unit 21 includes, for example, a differential amplifier and an analog-to-digital (AD) converter.

The current measurement unit 22 measures the value of current flowing through the multiple cells S1 to Sn based on the voltage at both ends of a shunt resistor Rs connected in series to the multiple cells S1 to Sn and supplies the measured current value to the control unit 23. The current measurement unit 22 includes, for example, a differential amplifier and an AD converter. Another current detection element, such as a Hall element, may be used, instead of the shunt resistor Rs.

The control unit 23 manages the multiple cells S1 to Sn based on the voltage of each of the multiple cells S1 to Sn, which is measured by the voltage measurement unit 21, the current flowing through the multiple cells S1 to Sn, which is measured by the current measurement unit 22, and the temperatures of the multiple cells S1 to Sn, which are measured by a temperature measurement unit (not illustrated). The control unit 23 performs, for example, state-of-charge (SOC) control and equalization control of the multiple cells S1 to Sn. In the present embodiment, the control unit 23 performs deterioration diagnosis of each cell.

The configuration of the control unit 23 is capable of being realized by cooperation of hardware resources and software resources or only by the hardware resources. A microcomputer, a digital signal processor (DSP), a field programmable gate array (FPGA), a read only memory (ROM), a random access memory (RAM), and other large scale integration (LSI) circuits may be used as the hardware resources. Programs including firmware may be used as the software resources. The storage unit 24 is capable of being realized by a non-volatile memory.

An operation display unit 30 generates an operation signal based on the content of an operation by a user and supplies the generated operation signal to the control unit 23. In addition, the operation display unit 30 displays information, such as a message or a status, which concerns the power storage system 1, based on a display signal supplied from the control unit 23. The operation display unit 30 is capable of being realized by, for example, a touch panel display. The operation display unit 30 may be realized by a display and physical buttons, instead of the touch panel display. For example, a remote controller, a speaker, and/or a microphone may be additionally used.

Although the stationary use is assumed for the circuit configuration illustrated in FIG. 1, the bidirectional inverter is installed, instead of the power conditioner 4, and a motor is used as the load 3 in the in-vehicle use. In the in-vehicle use, the power storage system 1 is not connected to the system 2 except when plug-in charge is performed.

The internal resistance of the lithium ion battery is increased and the lithium ion battery is increasingly deteriorated with the increasing number of times of charge-discharge. Separation of the contribution of each component to the increase in internal resistance makes a large contribution to improvement of the device and safety management. In the present embodiment, the internal resistance of the lithium ion battery is separated into the resistance components of the positive electrode, combined resistance components of the negative electrode and the electrolyte, and diffusion resistance components in a tank.

The alternating current impedance method is normally used for the separation of the resistance components of the lithium ion battery. However, a local oscillator capable of sweeping wide-range frequencies is required in the alternating current impedance method. When the oscillator is mounted in the battery management apparatus 20, the cost is increased.

Accordingly, in the present embodiment, the combined resistance of the negative electrode and the electrolyte, the resistance of the positive electrode, and the diffusion resistance are separated from each other and extracted using time-voltage waveforms acquired from direct current internal resistance (DCIR) in direct current discharge from the lithium ion battery with constant current and direct current charge of the lithium ion battery with the constant current.

Relationship described in Fourier transform is established between frequency response (alternating current internal resistance (ACIR)) and time response (direct current internal resistance (DCIR)). For example, the resistance components of the electrolyte+the negative electrode, which respond to at high frequencies in application of alternating current, appear as a voltage behavior that promptly responds to after start of application in the application of direct current. The voltage generated by the diffusion resistance components appears as a linear function behavior with respect to the ½ power (square root) of time.

In the present embodiment, the separation between the combined resistance components of the electrolyte+the negative electrode+the positive electrode and the diffusion resistance components and the separation between the combined resistance components of the electrolyte+the negative electrode and the resistance components of the positive electrode are performed using the these characteristics. A resistance separation algorithm using the DCIR according to the present embodiment will now be described with reference to the drawings. In specific examples described below, open circuit voltage is 3.6 V and the lithium ion battery of an SOC of 50% is charged with the constant current of 0.5 C for 30 seconds.

Figure 2:
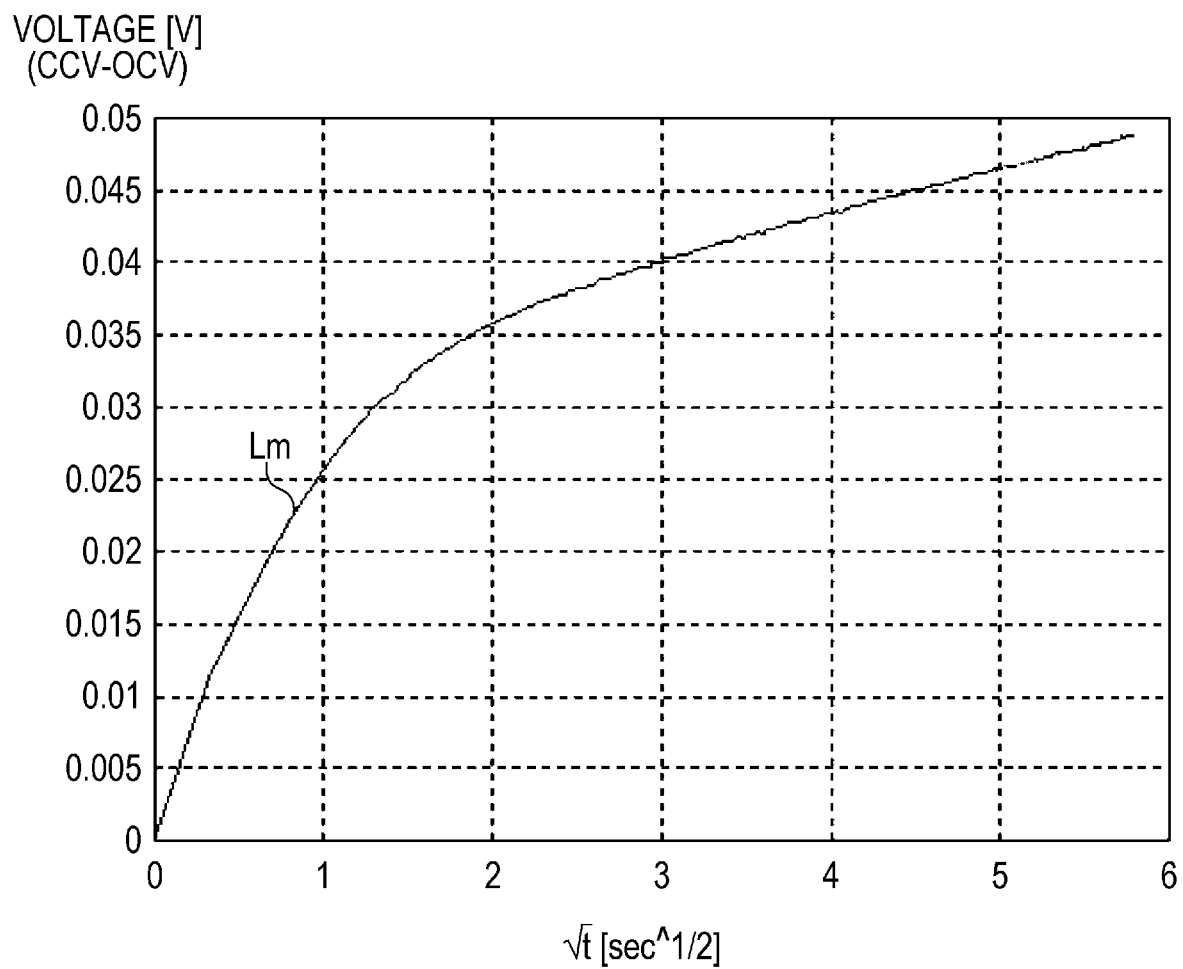
FIG. 2 illustrates a first state of a resistance separation algorithm using a DCIR according to the present embodiment.

FIG. 2 illustrates a first state of the resistance separation algorithm using the DCIR according to the present embodiment. Referring to FIG. 2, the horizontal axis represents the value of the ½ power (square root) of time and the vertical axis represents the value given by subtracting the open circuit voltage (OCV) from closed circuit voltage (CCV) that is measured. FIG. 2 indicates a voltage waveform (a measured line Lm) resulting from conversion of raw waveform data given by subtracting the open circuit voltage from cell voltage measured with a period of 0.1 seconds on a √t axis, plotting of the converted raw waveform data, and interpolation of the raw waveform data with Δ√t=0.01. As illustrated in FIG. 2, the voltage value (CCV−OCV) plotted on the √t axis exhibits a slow initial rise and increases as a liner function from a middle point.

Figure 3:
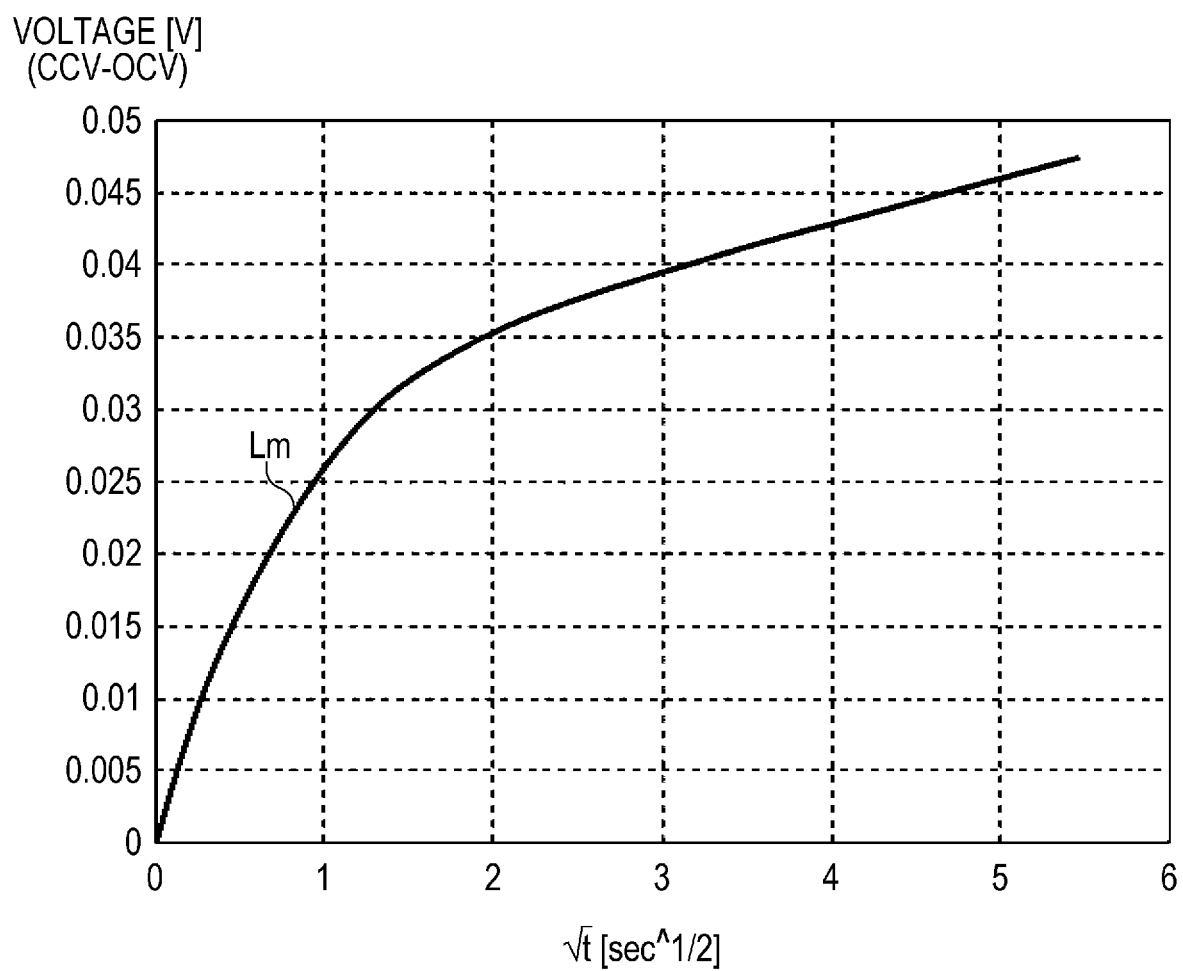
FIG. 3 illustrates a second state of the resistance separation algorithm using the DCIR according to the present embodiment.

FIG. 3 illustrates a second state of the resistance separation algorithm using the DCIR according to the present embodiment. FIG. 3 indicates a voltage waveform (the measured line Lm) resulting from smoothing of the voltage waveform in FIG. 2.

Figure 4:
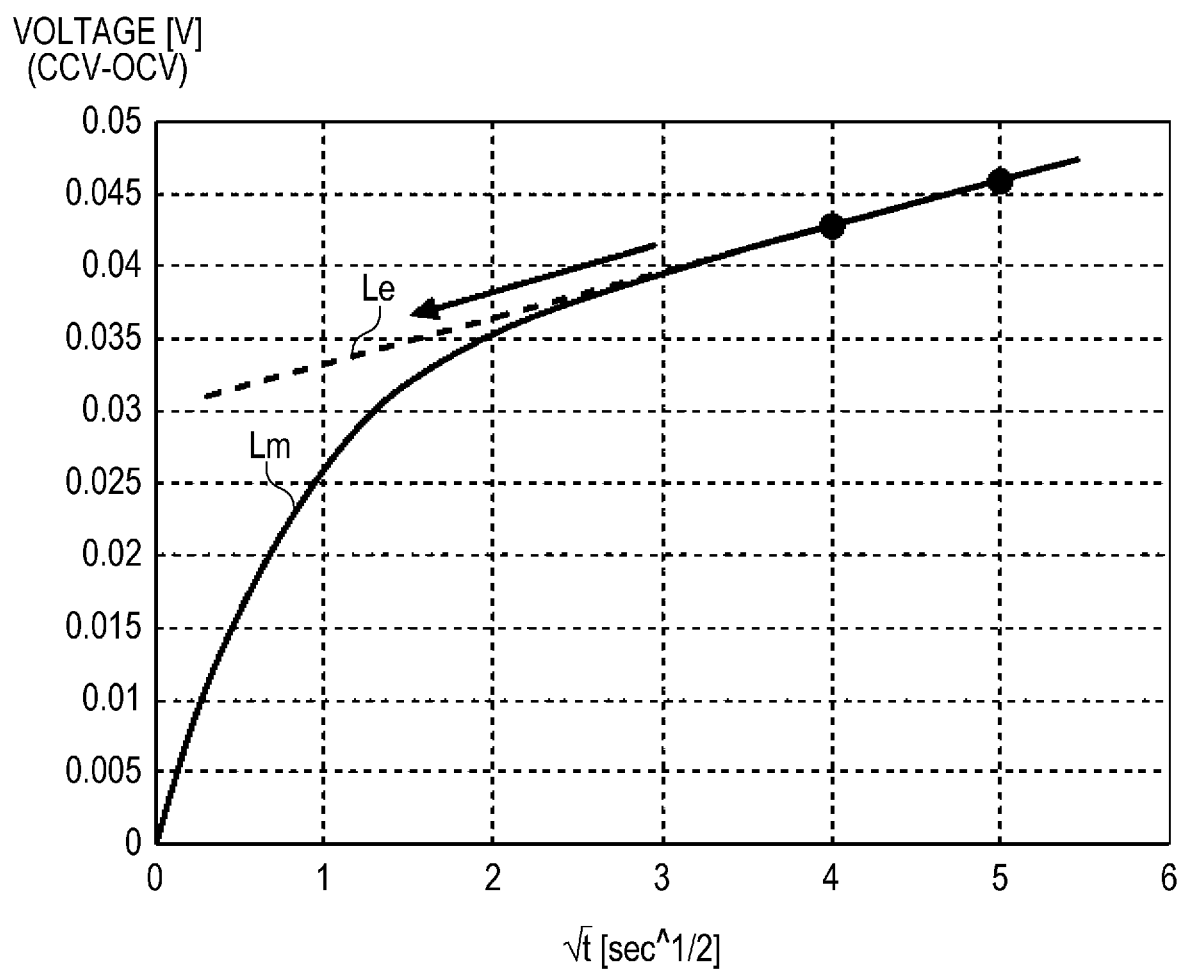
FIG. 4 illustrates a third state of the resistance separation algorithm using the DCIR according to the present embodiment.

FIG. 4 illustrates a third state of the resistance separation algorithm using the DCIR according to the present embodiment. An extrapolated straight line Le is generated based on the data on an interval of √t=4 to 5 of the measured line Lm. In a case of an interval in which it is confirmed that the measured line Lm exhibits a straight line, the extrapolated straight line Le may be generated using data other than the data on the interval of √t=4 to 5.

Figure 5:
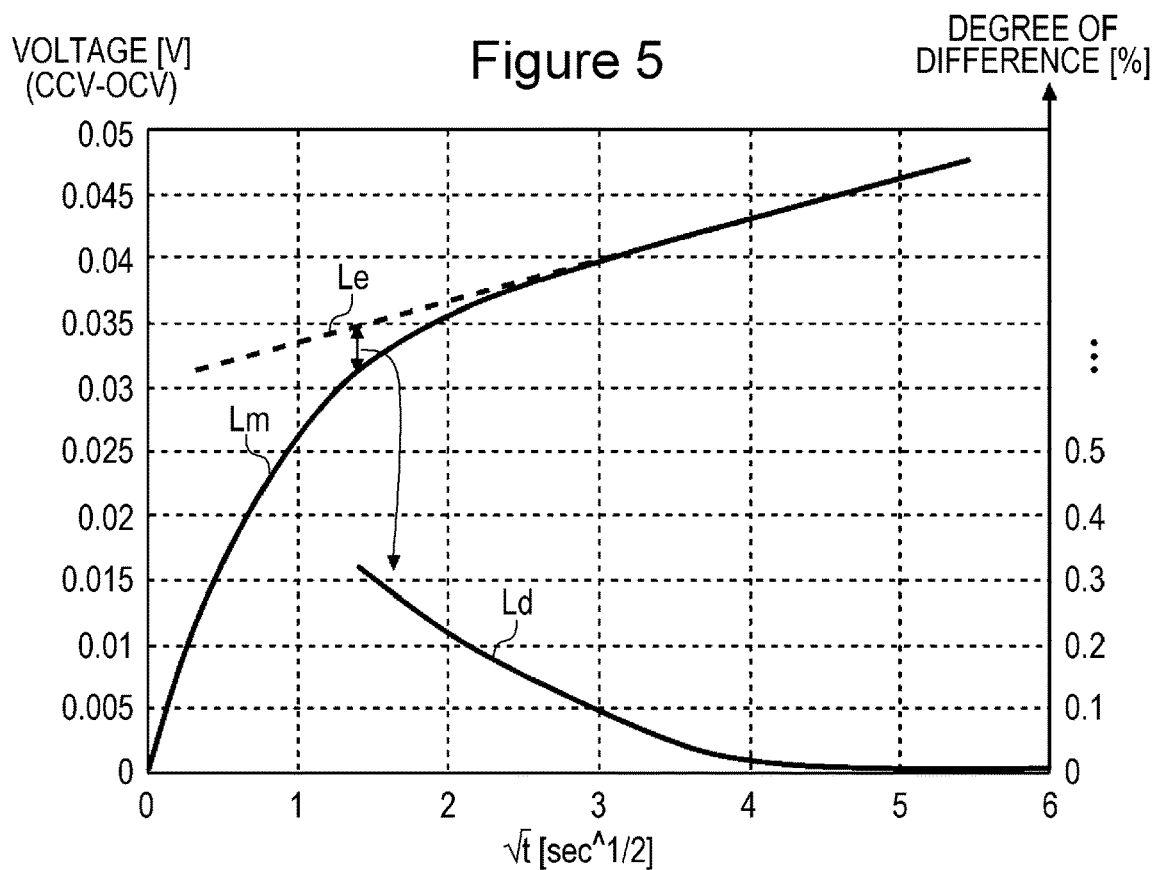
FIG. 5 illustrates a fourth state of the resistance separation algorithm using the DCIR according to the present embodiment.

FIG. 5 illustrates a fourth state of the resistance separation algorithm using the DCIR according to the present embodiment. A degree of difference between the extrapolated straight line Le generated in FIG. 4 and the measured line Lm is calculated. The degree of difference is capable of being defined by, for example, the difference in voltage between the voltage on the extrapolated straight line Le and the voltage on the measured line Lm, the percentage resulting from normalization of the difference in voltage with the measured voltage, the ratio of the gradient of the extrapolated straight line Le with respect to the gradient of the measured line Lm, or the like. An example is used in FIG. 5 in which the degree of difference is defined by the percentage (%) resulting from normalization of the difference in voltage with the measured voltage. The transition of the degree of difference is indicated by a difference line Ld in FIG. 5.

Figure 6:
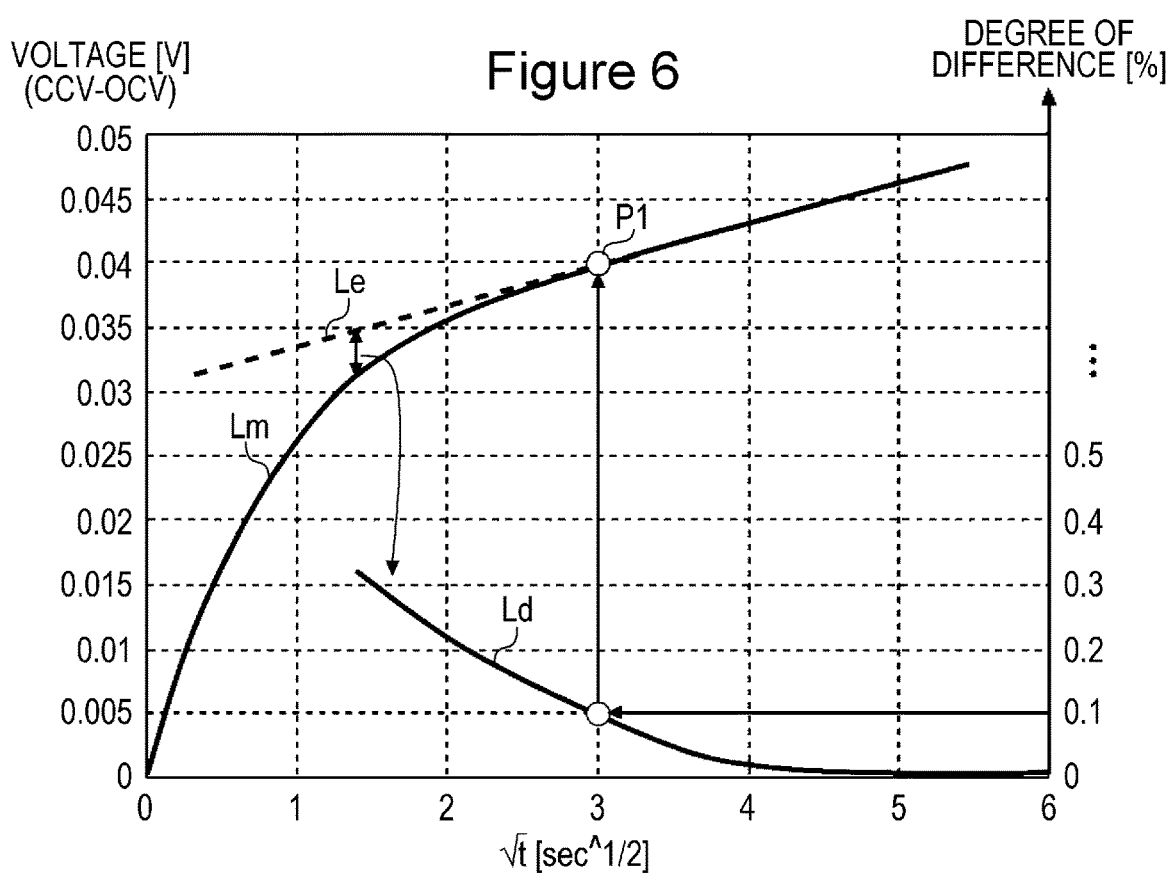
FIG. 6 illustrates a fifth state of the resistance separation algorithm using the DCIR according to the present embodiment.

FIG. 6 illustrates a fifth state of the resistance separation algorithm using the DCIR according to the present embodiment. A maximum point in the interval of √t in which the degree of difference calculated in FIG. 5 becomes greater than, for example, 0.1% is set at a boundary point P1 between the positive electrode resistance and the diffusion resistance. As described above, the rise in voltage during discharge, which is caused by the diffusion resistance components, appears as a linear function behavior with respect to the ½ power (square root) of time. Accordingly, a change point where the rise in voltage during discharge is varied from a curved line shape to a straight line shape is at the boundary point P1 between the positive electrode resistance and the diffusion resistance.

FIG. 7 illustrates a sixth state of the resistance separation algorithm using the DCIR according to the present embodiment. A time point when t=0.1 seconds is set as a boundary point P2 between the positive electrode resistance and the negative electrode resistance+the electrolyte resistance. This example is premised on use of a cell the frequency response of the negative electrode resistance of which is around 10 Hz.

The negative electrode components and the positive electrode components of impedance (Nyquist plot), which are measured using alternating current impedance method and which are plotted on the complex plane, are respectively represented by arcs. The arcs of the negative electrode components appear at the high-frequency side and the arcs of the positive electrode components appear at the low-frequency side. The frequency response of the negative electrode resistance appears in a range of 100 Hz to 1 Hz in the case of the common lithium ion battery.

The frequency response of the electrolyte resistance appears near 1 kHz in the case of the common lithium ion battery. The time response appears near 0.001 seconds and it is difficult to measures the time response of the electrolyte resistance using a common voltage measurement circuit with high accuracy. Accordingly, in the present embodiment, the separation between the negative electrode resistance and the electrolyte resistance is not performed. When the increase in cost is permitted, installation of a local oscillator that oscillates an alternating-current waveform of 1 kHz in the battery management apparatus 20 enables the separation between the negative electrode resistance and the electrolyte resistance.

FIG. 8 illustrates a seventh state of the resistance separation algorithm using the DCIR according to the present embodiment. As illustrated in FIG. 8, in the rise in voltage of the cell due to the discharge-charge with the constant direct current, the rise to the boundary point P2 corresponds to the rise in voltage caused by the resistance components of the electrolyte+the negative electrode, the rise from the boundary point P2 to the boundary point P1 corresponds to the rise in voltage caused by the resistance components of the positive electrode, and the rise after the boundary point P1 corresponds to the rise in voltage caused by the diffusion resistance components. The respective resistance values are capable of being calculated by dividing the widths of the respective rises in voltage by the current value applied to the battery.

Figure 9:
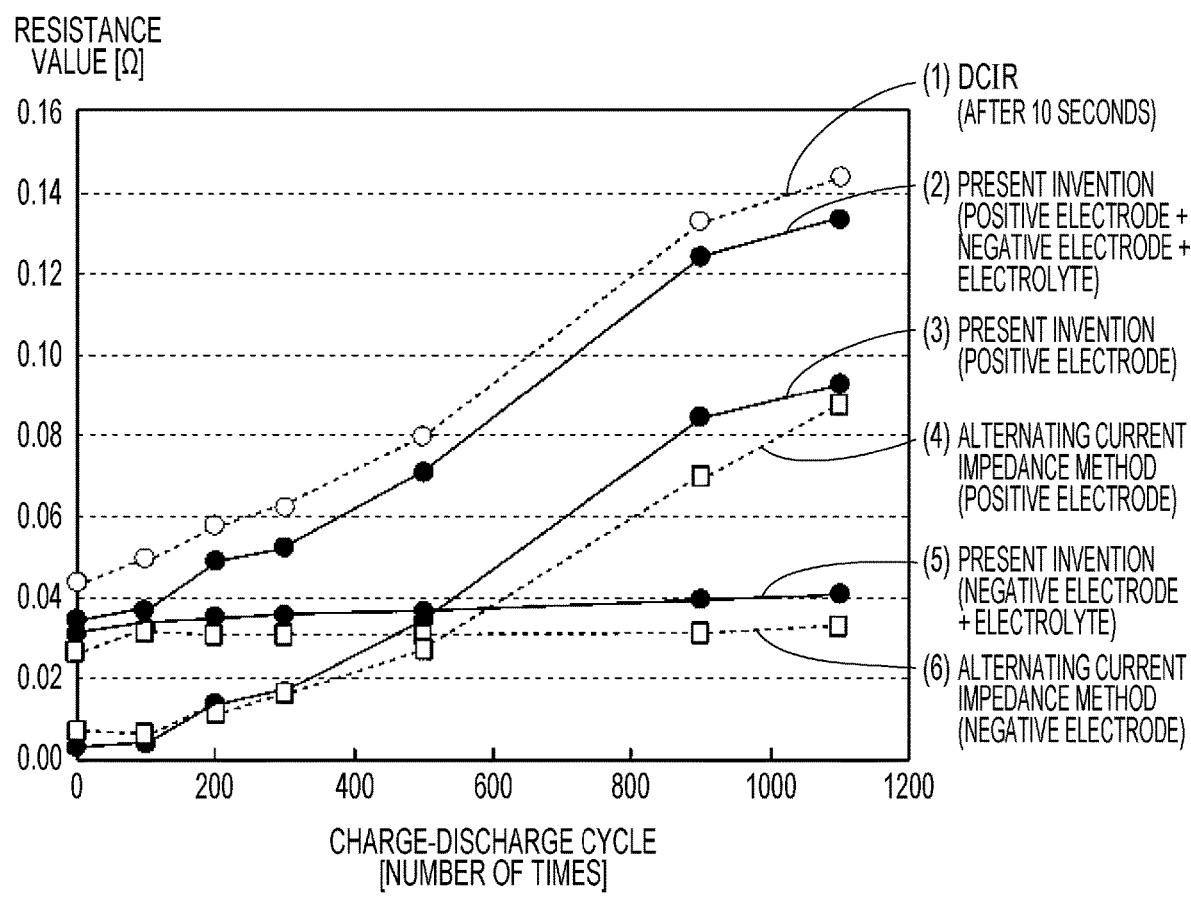
FIG. 9 is a graph resulting from comparison between the resistance separation using the DCIR according to the present embodiment and the resistance separation using an alternating current impedance method.

FIG. 9 is a graph resulting from comparison between the resistance separation using the DCIR according to the present embodiment and the resistance separation using the alternating current impedance method. Referring to FIG. 9, the horizontal axis represents the charge-discharge cycle and the vertical axis represents the resistance value. (1) The resistance value given by dividing the voltage variation width, which is measured after the discharge is performed for 10 seconds from the lithium ion battery of an SOC of 50% with 0.5 C, by the applied current value, (2) the resistance value of the positive electrode+the negative electrode+the electrolyte, which is measured using the above method according to the present embodiment, (3) the resistance value of the positive electrode, which is measured using the above method according to the present embodiment, (4) the resistance value of the positive electrode, which is measured using the alternating current impedance method, (5) the resistance value of the negative electrode+ the electrolyte, which is measured using the above method according to the present embodiment, and (6) the resistance value of the negative electrode, which is measured using the alternating current impedance method, are sequentially illustrated from the top.

It is indicated that the resistance separation using the DCIR according to the present embodiment has a separation accuracy similar to that of the resistance separation using the alternating current impedance method. It is also indicated that the deterioration due to the increase in the resistance of the positive electrode is greatly increased with the increasing number of times of charge-discharge while the deterioration due to the increase in the resistance of the negative electrode is gradually increased with the increasing number of times of charge-discharge.

Figure 10:
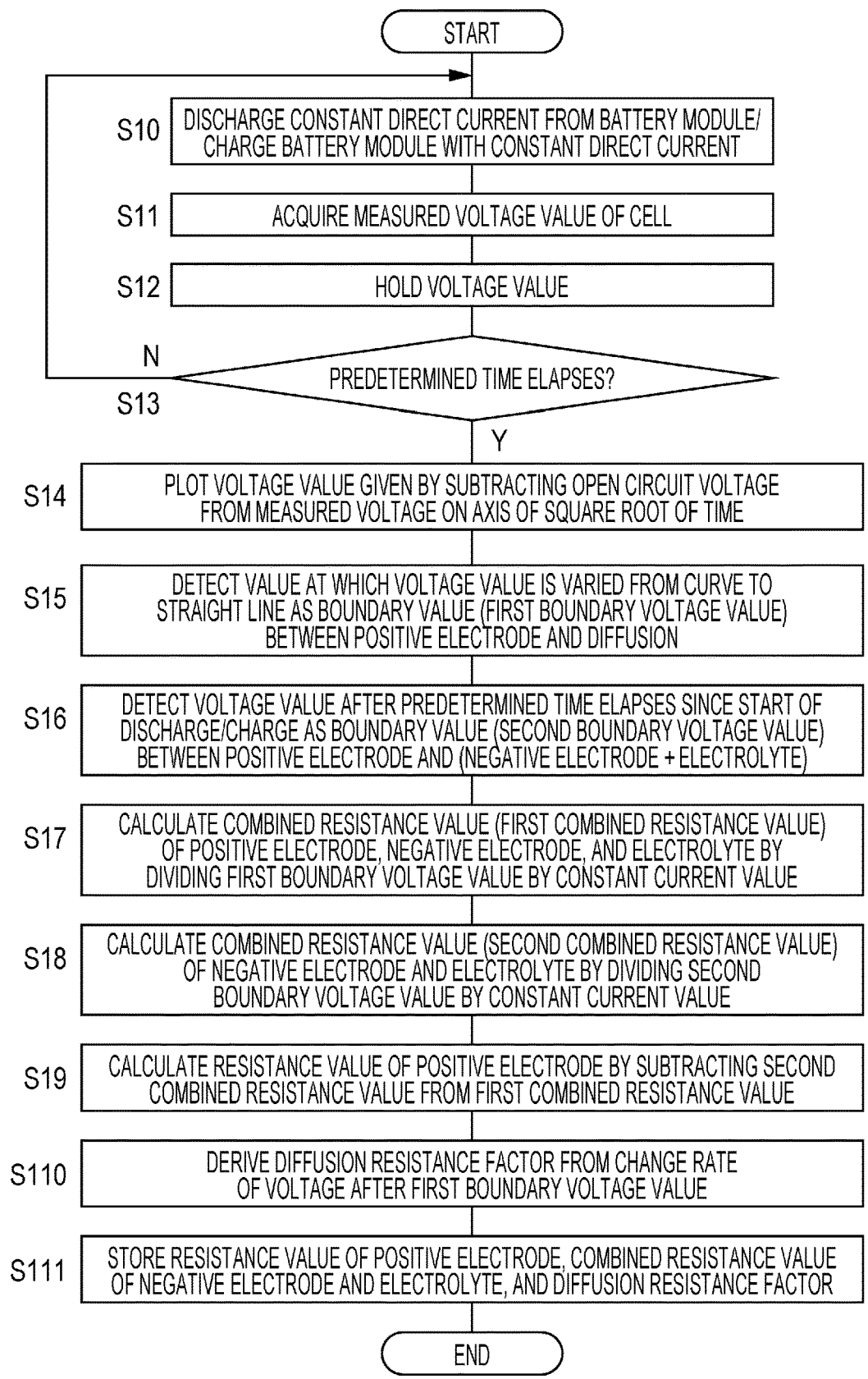
FIG. 10 is a flowchart illustrating the flow of an internal resistance separation process performed by a battery management apparatus according to an embodiment of the present invention.

FIG. 10 is a flowchart illustrating the flow of an internal resistance separation process performed by the battery management apparatus 20 according to an embodiment of the present invention. The control unit 23 instructs the power conditioner 4 to discharge the constant direct current from the battery module 10 or charge the battery module 10 with the constant direct current (S10). The control unit 23 acquires the voltage value of each of the cells S1 to Sn, which is measured by the voltage measurement unit 21 (S11). The control unit 23 temporarily holds the acquired voltage value in a working area (S12). Step S11 to Step S13 are continuously performed (NO in S13) until a predetermined time (30 seconds in the present embodiment) elapses (YES in S13).

The control unit 23 plots the voltage value given by subtracting the open circuit voltage of the cell from the measured voltage of the cell during each sampling period on the axis of the square root of time (S14). The control unit 23 detects a value at which the plotted voltage value is varied from a curved line shape to a straight line shape as a boundary value (hereinafter referred to as a first boundary voltage value) between the rise in voltage caused by the positive electrode resistance and the rise in voltage caused by the diffusion resistance (S15).

The control unit 23 detects the voltage value after a predetermined time (0.1 seconds in the present embodiment) elapses since start of the discharge-charge as a boundary value (hereinafter referred to as a second boundary voltage value) between the rise in voltage caused by the negative electrode+the electrolyte and the rise in voltage caused by the positive electrode resistance (S16).

The control unit 23 calculates the combined resistance value (hereinafter referred to as a first combined resistance value) of the positive electrode+the negative electrode+the electrolyte by dividing the first boundary voltage value by the above constant current value (S17). The control unit 23 calculates the combined resistance value (hereinafter referred to as a second combined resistance value) of the negative electrode+the electrolyte by dividing the second boundary voltage value by the above constant current value (S18). The control unit 23 calculates the resistance value of the positive electrode by subtracting the second combined resistance value from the first combined resistance value (S19). The control unit 23 derives a diffusion resistance factor from the change rate of the voltage after the first boundary voltage value (S110). The gradient of the diffusion resistance factor is increased as the battery is increasingly deteriorated.

The derivation of the resistance value of the positive electrode, the resistance value of the negative electrode+the electrolyte, and the diffusion resistance factor is performed for each cell. The control unit 23 stores the resistance value of the positive electrode, the combined resistance value of the negative electrode+the electrolyte, and the diffusion resistance factor in the storage unit 24 (S111).

FIG. 11 is a flowchart illustrating the flow of a deterioration diagnosis process performed by the battery management apparatus 20 according to an embodiment of the present invention. The control unit 23 performs the internal resistance separation process illustrated in the flowchart in FIG. 10 (S20). The control unit 23 compares the resistance value of the positive electrode, the combined resistance value of the negative electrode+the electrolyte, and the diffusion resistance factor with the corresponding deterioration determination threshold values (S21). A battery manufacturer derives in advance the deterioration determination threshold value for the positive electrode resistance, the deterioration determination threshold value for the combined resistance of the negative electrode+the electrolyte, and the deterioration determination threshold value for the diffusion resistance factor through experiment or simulation and stores the derived values in the control unit 23 or the storage unit 24.

If at least one resistance value or factor higher than or equal to the deterioration determination threshold value exists (YES in S22) as the result of the above comparison, the control unit 23 outputs an alert indicating that the resistance value or factor reaches the deterioration determination threshold value to the operation display unit 30 for display. Alternatively, the control unit 23 instructs the power conditioner 4 to stop the charge-discharge operation of the battery module 10.

Alternatively, the control unit 23 performs both the output of the alert and the stop of the charge-discharge operation of the battery module 10 (S26). In the display of the alert in the operation display unit 30, which component reaches the deterioration determination threshold value may also be displayed.

If no resistance value and factor higher than or equal to the deterioration determination threshold value exist (NO in S22) as the result of the above comparison, the control unit 23 changes the upper limits of discharge current and/or charge current of the cell based on the calculated diffusion resistance factor, the calculated resistance value of the positive electrode, or the calculated combined resistance value of the electrolyte and the negative electrode (S23).

The voltage is increased with the increasing resistance even if the current of the same value is caused to flow. When the discharge current or the charge current of the upper limit flows through each component member because of the increase in resistance of the component member, the voltage of the component member may exceed breakdown voltage. When any component member exceeding the breakdown voltage exists due to the increase in internal resistance, the control unit 23 decreases the upper limits of the discharge current and/or the charge current to the discharge current value and/or the charge current value at which the breakdown voltage does not occur. When no component member exceeding the breakdown voltage exists, it is not necessary to change the upper limits of the discharge current and/or the charge current.

The control unit 23 estimates a remaining charge-discharge count of each cell based on the transition of the diffusion resistance factor, the resistance value of the positive electrode, and the combined resistance value of the electrolyte and the negative electrode, which are stored in the storage unit 24 and which are actually measured (S24). As illustrated in FIG. 9, the internal resistance of each component member is increased with the increasing number of times of charge-discharge. The battery manufacturer derives in advance the transition of the diffusion resistance factor, the resistance value of the positive electrode, the combined resistance value of the electrolyte and the negative electrode through experiment or simulation and stores the derived values in the control unit 23 or the storage unit 24.

The control unit 23 compares the transition of the diffusion resistance factor, the resistance value of the positive electrode, the combined resistance value of the electrolyte and the negative electrode, which are registered, with the transition of the diffusion resistance factor, the resistance value of the positive electrode, the combined resistance value of the electrolyte and the negative electrode, which are measured, to estimate the remaining charge-discharge count of each component member. Among the remaining charge-discharge counts of the respective component members, the minimum remaining charge-discharge count is set as the remaining charge-discharge count of the cell. In addition, among the remaining charge-discharge counts of the multiple cells S1 to Sn, the minimum remaining charge-discharge count is set as the remaining charge-discharge count of the battery module 10. The control unit 23 outputs the estimated remaining charge count of the battery module 10 to the operation display unit 30 for display.

In an application for which stable relationship is established between the number of times of charge-discharge and the usage period, the control unit 23 may estimate a remaining usage period of the battery module 10 and may output the estimated remaining usage period to the operation display unit 30 for display.

When the charge-discharge is performed a predetermined number of times (for example, 100 times) since the previous internal resistance separation process (YES in S25), the process goes back to Step S20 to repeat Step S20 to Step S24. The process may go back to Step S20 each time a predetermined time period (for example, one month) elapses to repeat Step S20 to Step S24.

As described above, according to the present embodiment, it is possible to simply perform separation analysis of the internal resistance of the secondary battery at a low cost using the time-voltage waveforms acquired from the time response (DCIR) in the discharge-charge with the constant direct current. Since the time response (DCIR) is used, the local oscillator capable of sweeping wide-range frequencies, which is required in the alternating current impedance method, is not required. Accordingly, it is not necessary to mount the oscillator in the battery management apparatus 20 to suppress an increase in the cost and an increase in the circuit area.

In addition, since the direct current caused to flow in the diagnosis is the direct current capable of being caused to flow in the normal charge-discharge control, it is possible to simply perform the diagnosis without changing the hardware configuration of the power storage system 1 even after the operation of the power storage system 1 is started. A complicated work, such as contact between a probe terminal and both ends of each cell, does not occur. Furthermore, since automatic diagnosis is capable of being periodically performed, the deterioration diagnosis of each component member is capable of being conveniently performed with the user being unconscious. The battery management apparatus 20 is capable of being mounted in the existing power storage system 1 only by additionally installing the firmware in the control unit 23 and is easily realized.

Although the present invention has been described based on the embodiments, the embodiments are only examples. It will be further understood by those skilled in the art that various modifications may be made to combination of the components and the processes and such modifications are within the scope of the present invention.

Although the example is assumed in the above embodiments in which the lithium ion battery is used, the same principle applies to other chemical batteries, such as a nickel hydride battery, in the same manner.

The example is described in the above embodiments in which the deterioration diagnosis of each cell in the battery module 10 is performed by the battery management apparatus 20 in the power storage system 1. The deterioration diagnosis of multiple power storage systems 1 may be intensively performed using a centralized management apparatus connected to the battery management apparatus 20 via a network. In this case, the battery management apparatus 20 in each power storage system 1 transmits the measured voltage value of each of the cells S1 to Sn and the measured value of the current flowing through the multiple cells S1 to Sn to the battery management apparatus 20 via a network, such as the Internet or a dedicated line. It is not necessary for the battery management apparatus 20 to have the deterioration diagnosis function as long as the battery management apparatus 20 has the communication function. Accordingly, the battery manufacturer is capable of efficiently collecting deterioration diagnosis data about its own products.

The embodiments may be identified by the following items.

[Item 1]

A battery diagnosis method includes discharging constant direct current from a battery for a predetermined time period or charging the battery with the constant direct current for the predetermined time period, measuring voltage of the battery, identifying a change point where a rise in voltage given by subtracting open circuit voltage of the battery from the measured voltage of the battery is varied from a curved line shape to a straight line shape with respect to transition of an increase of a value in which an elapsed time since start of charge-discharge is defined as a square root of time, and identifying a rise in voltage from the voltage when the charge-discharge is started to the change point as a rise in voltage caused by resistance components of electrolyte, a negative electrode, and a positive electrode of the battery and identifying a rise in voltage after the change point as a rise in voltage caused by a diffusion resistance component of the battery.

In this description, "the value defined as a square root of time" is a concept including a value substantially equal to a value that is the 0.5 power of time, such as a value that is the 0.51 power of time.

With the above method, it is possible to simply separate the rise in voltage caused by the resistance components of the electrolyte, the negative electrode, and the positive electrode of the battery from the rise in voltage caused by the diffusion resistance component of the battery at a low cost.

[Item 2]

The battery diagnosis method described in Item 1 further includes identifying a rise in voltage until a predetermined time set in advance based on frequency response of the resistance component of the negative electrode of the battery elapses since the start of the charge-discharge as a rise in voltage caused by the electrolyte and the negative electrode of the battery.

With the above method, it is possible to simply separate the rise in voltage caused by the resistance components of the electrolyte and the negative electrode of the battery from the rise in voltage caused by the resistance component of the positive electrode of the battery at a low cost.

[Item 3]

A battery diagnosis program causes a computer to perform a process including identifying a change point where a rise in voltage given by subtracting open circuit voltage of a battery from measured voltage of the battery is varied from a curved line shape to a straight line shape with respect to transition of an increase of a value in which an elapsed time since start of control, in which constant direct current is discharged from the battery for a predetermined time period or the battery is charged with the constant direct current for the predetermined time period, is defined as a square root of time, and identifying a rise in voltage from the voltage when charge-discharge is started to the change point as a rise in voltage caused by resistance components of electrolyte, a negative electrode, and a positive electrode of the battery and identifying a rise in voltage after the change point as a rise in voltage caused by a diffusion resistance component of the battery.

The computer is capable of executing the diagnosis program stored in a non-transitory computer readable medium.

With the above program, it is possible to simply separate the rise in voltage caused by the resistance components of the electrolyte, the negative electrode, and the positive electrode of the battery from the rise in voltage caused by the diffusion resistance component of the battery at a low cost.

[Item 4]

The battery diagnosis program described in Item 3 causes a computer to perform the process further including identifying a rise in voltage until a predetermined time set in advance based on frequency response of the resistance component of the negative electrode of the battery elapses since the start of the charge-discharge as a rise in voltage caused by the electrolyte and the negative electrode of the battery.

With the above program, it is possible to simply separate the rise in voltage caused by the resistance components of the electrolyte and the negative electrode of the battery from the rise in voltage caused by the resistance component of the positive electrode of the battery at a low cost.

[Item 5]

A battery management apparatus (20) includes a current measurement unit (21) that measures current flowing through a battery (S1 to Sn), a voltage measurement unit (22) that measures voltage of the battery (S1 to Sn), and a control unit (23) that discharges constant direct current from the battery (S1 to Sn) for a predetermined time period or charges the battery (S1 to Sn) with the constant direct current for the predetermined time period to diagnose a state of the battery.

The control unit (23) identifies a change point where a rise in voltage given by subtracting open circuit voltage of the battery (S1 to Sn) from the measured voltage of the battery (S1 to Sn) is varied from a curved line shape to a straight line shape with respect to transition of an increase of a value in which an elapsed time since start of charge-discharge is defined as a square root of time.

The control unit (23) identifies a rise in voltage from the voltage when the charge-discharge is started to the change point as a rise in voltage caused by resistance components of electrolyte, a negative electrode, and a positive electrode of the battery (S1 to Sn) and identifies a rise in voltage after the change point as a rise in voltage caused by a diffusion resistance component of the battery (S1 to Sn).

With the above apparatus, it is possible to simply separate the rise in voltage caused by the resistance components of the electrolyte and the negative electrode of the battery (S1 to Sn) from the rise in voltage caused by the resistance component of the positive electrode of the battery (S1 to Sn) at a low cost.

[Item 6]

In the battery management apparatus (20) described in Item 5, the control unit (23) identifies a rise in voltage until a predetermined time set in advance based on frequency response of the resistance component of the negative electrode of the battery (S1 to Sn) elapses since the start of the charge-discharge as a rise in voltage caused by the electrolyte and the negative electrode of the battery (S1 to Sn).

With the above apparatus, it is possible to simply separate the rise in voltage caused by the resistance components of the electrolyte and the negative electrode of the battery (S1 to Sn) from the rise in voltage caused by the resistance component of the positive electrode of the battery (S1 to Sn) at a low cost.

[Item 7]

In the battery management apparatus (20) described in Item 6, the control unit (23) calculates a combined resistance value of the electrolyte, the negative electrode, and the positive electrode of the battery (S1 to Sn) by dividing the rise in voltage caused by the resistance components of the electrolyte, the negative electrode, and the positive electrode of the battery (S1 to Sn) by the constant direct current, the control unit (23) derives a diffusion resistance factor of the battery (S1 to Sn) based on a rate of the rise in voltage caused by the diffusion resistance component of the battery (S1 to Sn), the control unit (23) calculates a combined resistance value of the electrolyte and the negative electrode of the battery (S1 to Sn) by dividing the rise in voltage caused by the electrolyte and the negative electrode of the battery (S1 to Sn) by the constant direct current, and the control unit (23) calculates the resistance value of the positive electrode of the battery (S1 to Sn) by subtracting the combined resistance value of the electrolyte and the negative electrode of the battery (S1 to Sn) from the combined resistance value of the electrolyte, the negative electrode, and the positive electrode of the battery (S1 to Sn).

With the above apparatus, it is possible to estimate the values of the combined resistance of the electrolyte, the negative electrode, and the positive electrode, the diffusion resistance factor, and the combined resistance of the electrolyte and the negative electrode of the battery (S1 to Sn).

[Item 8]

In the battery management apparatus (20) described Item 7, the control unit (23) outputs an alert and/or stops the charge-discharge of the battery (S1 to Sn) if the calculated diffusion resistance factor is higher than or equal to a deterioration determination threshold value for the diffusion resistance, the control unit (23) outputs an alert and/or stops the charge-discharge of the battery (S1 to Sn) if the calculated resistance value of the positive electrode is higher than or equal to a deterioration determination threshold value for the positive electrode resistance, and the control unit (23) outputs an alert and/or stops the charge-discharge of the battery (S1 to Sn) if the calculated combined resistance value of the electrolyte and the negative electrode is higher than or equal to a deterioration determination threshold value for the combined resistance of the electrolyte and the negative electrode.

With the above apparatus, if the battery (S1 to Sn) reaches its lifetime, it is possible to stop the charge-discharge operation by causing the user to recognize the lifetime of the battery (S1 to Sn) or automatically.

[Item 9]

In the battery management apparatus (20) described in Item 7, the control unit (23) changes upper limits of charge current and/or discharge current of the battery (S1 to Sn) based on the calculated diffusion resistance factor, the calculated resistance value of the positive electrode, and the calculated combined resistance value of the electrolyte and the negative electrode.

With the above apparatus, it is possible to avoid an occurrence of breakdown voltage of each component member.

[Item 10]

In the battery management apparatus (20) described in Item 7, the control unit (23) estimates a remaining usage period or a remaining charge-discharge count of the battery (S1 to Sn) based on transition of the calculated diffusion resistance factor, the calculated resistance value of the positive electrode, and the calculated combined resistance value of the electrolyte and the negative electrode.

With the above apparatus, it is possible to use the remaining usage period or the remaining charge-discharge count as a guide to, for example, the time for replacement of the battery (S1 to Sn).

[Item 11]

In the battery management apparatus (20) described in any of Items 5 to 10, the control unit (23) performs control so as to cause the constant direct current to flow through the battery (S1 to Sn) for 30 seconds or more.

With the above apparatus, it is possible to acquire the measured value of a time period sufficient for the resistance separation.

[Item 12]

A power storage system (1) includes a battery module (10) including a battery (S1 to Sn), and the battery management apparatus (20) according to any of Items 5 to 11, which manages the battery module (10).

With the above system, it is possible to realize the power storage system (1) capable of simply separating the rise in voltage caused by the resistance components of the electrolyte, the negative electrode, and the positive electrode of the battery from the rise in voltage caused by the diffusion resistance component of the battery at a low cost.

INDUSTRIAL APPLICABILITY

The present invention is usable for the battery diagnosis method, the battery diagnosis program, the battery management apparatus, and the power storage system.

REFERENCE SIGNS LIST 1 power storage system
2 system
3 load
4 power conditioner
10 battery module
20 battery management apparatus
21 voltage measurement unit
22 current measurement unit
23 control unit
24 storage unit
S1, S2, Sn cell
Rs shunt resistor
30 operation display unit

The invention claimed is:

1. A battery diagnosis method comprising:
performing a charge-discharge control of discharging constant direct current from a battery for a predetermined time period or charging the battery with the constant direct current for the predetermined time period;
measuring voltage of the battery;
identifying a change point where a rise in voltage given by subtracting open circuit voltage of the battery from the measured voltage of the battery is varied from a curved line shape to a straight line shape with respect to transition of an increase of a value in which an elapsed time since start of the charge-discharge control is defined as a square root of the elapsed time;
identifying a rise in voltage from the voltage when the charge-discharge control is started to the change point as a rise in voltage caused by resistance components of electrolyte, a negative electrode, and a positive electrode of the battery and identifying a rise in voltage after the change point as a rise in voltage caused by a diffusion resistance component of the battery; and
identifying a rise in voltage until a predetermined time set in advance based on frequency response of the resistance component of the negative electrode of the battery elapses since the start of the charge-discharge control as a rise in voltage caused by the electrolyte and the negative electrode of the battery.

2. A non-transitory computer readable medium storing a battery diagnosis program, which causes a computer to perform a process comprising:
identifying a change point where a rise in voltage given by subtracting open circuit voltage of the battery from measured voltage of the battery is varied from a curved line shape to a straight line shape with respect to transition of an increase of a value in which an elapsed time since start of a charge-discharge control, in which constant direct current is discharged from a battery for a predetermined time period or the battery is charged with the constant direct current for the predetermined time period, is defined as a square root of the elapsed time;

identifying a rise in voltage from the voltage when the charge-discharge control is started to the change point as a rise in voltage caused by resistance components of electrolyte, a negative electrode, and a positive electrode of the battery and identifying a rise in voltage after the change point as a rise in voltage caused by a diffusion resistance component of the battery; and identifying a rise in voltage until a predetermined time set in advance based on frequency response of the resistance component of the negative electrode of the battery elapses since the start of the charge-discharge control as a rise in voltage caused by the electrolyte and the negative electrode of the battery.

3. A battery management apparatus comprising:

a current measurement unit that measures current flowing through a battery;

a voltage measurement unit that measures voltage of the battery; and a control unit that performs a charge-discharge control, in which the control unit discharges constant direct current from the battery for a predetermined time period or charges the battery with the constant direct current for the predetermined time period to diagnose a state of the battery, wherein the control unit identifies a change point where a rise in voltage given by subtracting open circuit voltage of the battery from the measured voltage of the battery is varied from a curved line shape to a straight line shape with respect to transition of an increase of a value in which an elapsed time since start of the charge-discharge control is defined as a square root of the elapsed time, wherein the control unit identifies a rise in voltage from the voltage when the control charge-discharge is started to the change point as a rise in voltage caused by resistance components of electrolyte, a negative electrode, and a positive electrode of the battery and identifies a rise in voltage after the change point as a rise in voltage caused by a diffusion resistance component of the battery, and wherein the control unit identifies a rise in voltage until a predetermined time set in advance based on frequency response of the resistance component of the negative electrode of the battery elapses since the start of the charge-discharge control as a rise in voltage caused by the electrolyte and the negative electrode of the battery.

4. The battery management apparatus according to claim 3, wherein the control unit calculates a combined resistance value of the electrolyte, the negative electrode, and the positive electrode of the battery by dividing the rise in voltage caused by the resistance components of the electrolyte, the negative electrode, and the positive electrode of the battery by the constant direct current, wherein the control unit derives a diffusion resistance factor of the battery based on a rate of the rise in voltage caused by the diffusion resistance component of the battery, wherein the control unit calculates a combined resistance value of the electrolyte and the negative electrode of the battery by dividing the rise in voltage caused by the electrolyte and the negative electrode of the battery by the constant direct current, and wherein the control unit calculates the resistance value of the positive electrode of the battery by subtracting the combined resistance value of the electrolyte and the negative electrode of the battery from the combined resistance value of the electrolyte, the negative electrode, and the positive electrode of the battery.

5. The battery management apparatus according to claim 4, wherein the control unit performs at least one of output of an alert and stop of the charge-discharge control of the battery if the calculated diffusion resistance factor is higher than or equal to a deterioration determination threshold value for the diffusion resistance, wherein the control unit performs at least one of the output of an alert and the stop of the charge-discharge control of the battery if the calculated resistance value of the positive electrode is higher than or equal to a deterioration determination threshold value for the positive electrode resistance, and wherein the control unit performs at least one of the output of an alert and the stop of the charge-discharge control of the battery if the calculated combined resistance value of the electrolyte and the negative electrode is higher than or equal to a deterioration determination threshold value for the combined resistance of the electrolyte and the negative electrode.

6. The battery management apparatus according to claim 4, wherein the control unit changes an upper limit of at least one of charge current and discharge current of the battery based on the calculated diffusion resistance factor, the calculated resistance value of the positive electrode, and the calculated combined resistance value of the electrolyte and the negative electrode.

7. The battery management apparatus according to claim 4, wherein the control unit estimates a remaining usage period or a remaining charge-discharge count of the battery based on transition of the calculated diffusion resistance factor, the calculated resistance value of the positive electrode, and the calculated combined resistance value of the electrolyte and the negative electrode.

8. The battery management apparatus according to claim 3, wherein the control unit causes the constant direct current to flow through the battery for 30 seconds or more.

9. A power storage system comprising:

a battery module including a battery; and the battery management apparatus according to claim 3, which manages the battery module.

10. A power storage system comprising:

a battery module including a battery; and the battery management apparatus according to claim 4, which manages the battery module.

11. A power storage system comprising:

a battery module including a battery; and the battery management apparatus according to claim 5, which manages the battery module.

12. A power storage system comprising:

a battery module including a battery; and the battery management apparatus according to claim 6, which manages the battery module.

13. A power storage system comprising:

a battery module including a battery; and the battery management apparatus according to claim 7, which manages the battery module.

14. A power storage system comprising:
a battery module including a battery; and
the battery management apparatus according to claim 8, which manages the battery module.

* * * * *